(12) United States Patent
Andersen

(10) Patent No.: US 8,659,308 B1
(45) Date of Patent: Feb. 25, 2014

(54) SELECTIVE OVERTRAVEL DURING ELECTRICAL TEST OF PROBE CARDS

(71) Applicant: Rudolph Technologies, Inc., Flanders, NJ (US)

(72) Inventor: James Charles Andersen, North Bend, WA (US)

(73) Assignee: Rudolph Technolgies, Inc., Flanders, NJ (US)

( * ) Notice: Subject to any disclaimer, the term of this patent is extended or adjusted under 35 U.S.C. 154(b) by 0 days.

(21) Appl. No.: 13/647,554

(22) Filed: Oct. 9, 2012

(51) Int. Cl.
*G01R 31/00* (2006.01)

(52) U.S. Cl.
USPC ............ 324/750.19; 324/750.22; 324/750.25; 324/754.03; 324/754.07; 324/756.03; 324/762.05; 324/750.01

(58) Field of Classification Search
USPC ............ 324/750.01, 750.16, 750.19, 750.22, 324/750.25, 754.03, 754.07, 754.11, 324/754.13, 755.04, 755.11, 756.03, 324/762.01, 762.05
See application file for complete search history.

(56) References Cited

U.S. PATENT DOCUMENTS

| | | | | |
|---|---|---|---|---|
| 5,422,579 A | * | 6/1995 | Yamaguchi | 324/750.19 |
| 6,096,567 A | * | 8/2000 | Kaplan et al. | 438/14 |
| 6,707,310 B2 | * | 3/2004 | Takekoshi | 324/750.19 |
| 7,800,387 B2 | * | 9/2010 | Kono | 324/750.19 |

* cited by examiner

*Primary Examiner* — Arleen M Vazquez
(74) *Attorney, Agent, or Firm* — Dicke, Billig & Czaja, PLLC

(57) ABSTRACT

An apparatus and method for conducting electrical testing of probes is disclosed. Probes may also be tested for deflection and loading hysteresis.

14 Claims, 7 Drawing Sheets

SELECTIVE OVERTRAVEL DURING ELECTRICAL TEST OF PROBE CARDS

TECHNICAL FIELD OF THE INVENTION

The present invention relates generally to apparatuses and methods of inspecting probe cards.

BACKGROUND OF THE INVENTION

Probe cards are used to electrical test semiconductor devices during fabrication. Probe cards are critical to ensuring quality of semiconductor devices and in maximizing yield of semiconductor fabrication processes. Accordingly, it is important to ensure that probe cards are in good working order.

Inspection of probe cards involves an assessment of the physical characteristics of each probe as well as the electrical characteristics of not only each probe, but of the entire probe card itself and the fixtures, known as motherboards, to which probe cards are coupled during use.

While probe cards can exert hundreds of pounds of force against a semiconductor wafer during the probing process, each individual probe in a probe card is very delicate and typically experiences no more than a few grams of force. Accordingly, it is necessary to take great care to avoid damaging probes during inspection. Probes are also very small, which can make it difficult to address individual probes for mechanical or electrical testing. One way that probes are addressed individually is by using a very small conductive post that has a flat top with a diameter that is only slightly larger than that of a probe tip. The flat top of the conductive post is addressed to each of a selected group of probes of a probe card (or all of them) to determine the electrical properties of the probe itself and the circuit to which the probe is connected. What is more, the conductive post may be biased or overtraveled against the tip of a probe. This application of force to a probe simulates the probing process and provides an indication of how the probe will function in the probe test cell. Force load cells in the mechanism that support a conductive post measure the relative force exerted by the probe against the conductive post as a function of the magnitude of the deflection to determine how the probe behaves mechanically. Finally, the small size of the conductive post allows the probe tip position to be verified by noting the position of the tip of the conductive post (by means of encoders associated with the support mechanism of the conductive probe) when the conductive post contacts the probe tip and makes an electrical connection. The nominal XY position of a probe may be specified a priori or determined optically.

Problems can arise however, where only a single probe is overtraveled. Overtraveling a single probe of an entire array or of a sub-set of a probe array can introduce differential deformation. Differential deformation, in the context of probe inspection, pertains to introducing undesirable variation into the mechanical characteristics of a probe with respect to other similarly situated probes of a probe card. In some instances that could manifest as an undesirable modification of the free hanging position of a probe tip due to some change in the probe itself or in the mechanism, structure or materials that secure the probe to the probe card. Differential deformation may also result in changes in the mechanical characteristics of a probe such as where fatigue in the probe results in a change in the spring constant of the probe. In other instances the electrical characteristics of a probe may change as where damage to a probe reduces conductivity or where deformation of the probe results in short circuiting of the probe. These problems apply primarily to cantilever-type probes, but can also apply to other types of probe card probe types such as blade, buckling beam, vertical, array, multi-DUT, micro-spring, etc. These examples are illustrative only and are not intended to be an exhaustive list of issues that may arise.

Further, it is desirable to avoid overtraveling probes too many times. Each probe of a probe card array has a more or less fixed life and can only withstand so much wear on the probe tips and only so much mechanical stress before a failure may occur. While this is clearly a statistical determination, in general, the fewer the number of times a probe is overtraveled during testing and analysis, the better.

Accordingly, there is a need for a probe card analysis mechanism and a related method that reduces the amount of differential deflection that may be experienced by the probes of a probe card and which also limits the number of times that a probe is overtraveled. Further, there is a need for such a mechanism and/or method to be flexible enough to be readily adaptable to different types of probe cards and/or to different probe array geometries or requirements.

DETAILED DESCRIPTION

Figure 1:
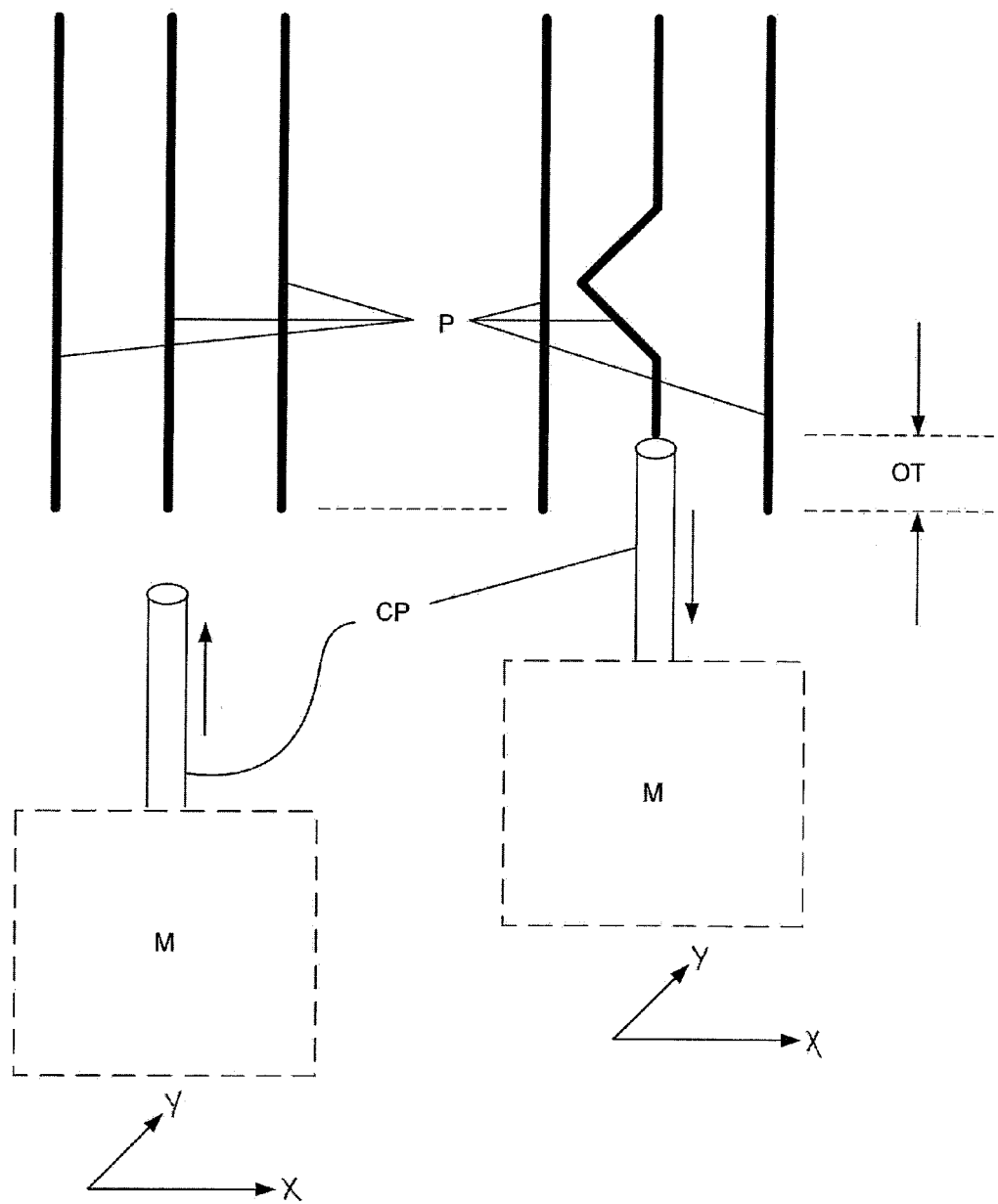
FIG. 1 is a schematic illustration of a prior art system for electrically testing individual probes during overtravel.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates how in the prior art an electrical test on an individual probe P that is under load has been conducted. The probe P is overtraveled by a conductive post CP, i.e. the tip of the conductive post CP is driven in contact with a probe P and then overtraveled a predetermined amount to simulate the actions that the probe P would experience in a prober during electrical test of semiconductor devices. In the left hand portion of FIG. 1, the conductive post CP is being moved upward toward probes P that are in free hanging space. After contact has been made with probe P, the conductive post CP continues upward to approximately the position that is shown in the right hand portion of FIG. 1. This distance is generally referred to as overtravel OT. As is well known by those skilled in the art, overtravel is the relative distance traveled between a probe and an object that is brought into contact with the probe P, the distance being measured after the point at which contact is first made. In both a wafer test cell and in an inspection context overtravel OT is imposed to ensure that good electrical contact is made between the probe P and the object. OT is also imposed, in an inspection context, to simulate OT and the associated probe movement and subsequent probe characteristics (mechanical and electrical) that occur during wafer test. In FIG. 1, the object is the conductive post CP. The conductive post CP and probe P form part of a test circuit (not shown) in the arrangement shown in the Figure. This test circuit conducts standard electrical tests such as resistance, capacitance, leakage, component functionality, and other suitable characteristics.

A prior art conductive post CP is coupled to a mechanism that is arranged to move the tip of the conductive post into contact with a selected probe P. This mechanism M, shown in dashed line in FIG. 1, includes or is coupled to (as the case may be) a stage (not shown) which moves the conductive probe CP in an XY plane relative to the probes P (note arrows indicative of an XY coordinate plane). Note that at this point in an inspection of probes P, the XY position of each has already been determined, typically optically. The conductive post CP is positioned beneath a selected probe P and then driven into contact with the probe P, the conductive post CP moving past initial contact to the overtravel position OT. The aforementioned electrical tests are then conducted. Further, the XY position of each probe P analyzed in this way may be confirmed by noting the XY position of the mechanism M. This generally involves reading off the values of linear encoders (not shown) associated with the mechanism M. Note that the position so determined is subject to error on the order of the diameter of the tip of the conductive post CP.

Figure 6:
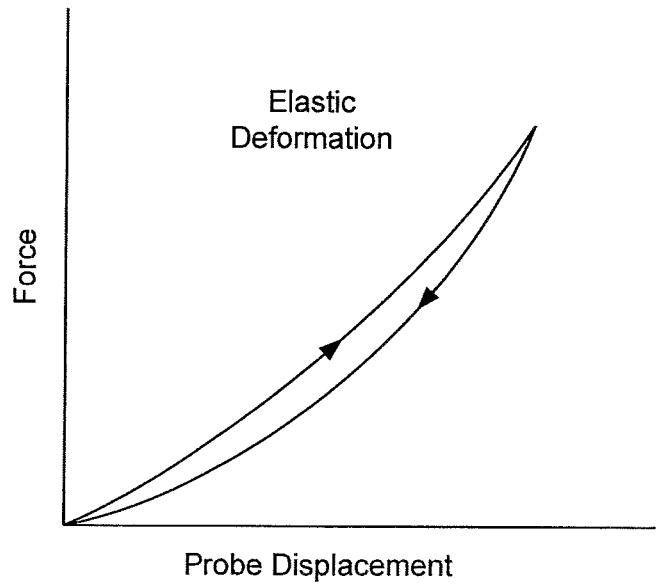
FIG. 6 illustrates schematically the movement of a probe during overtravel.
Figure 6:
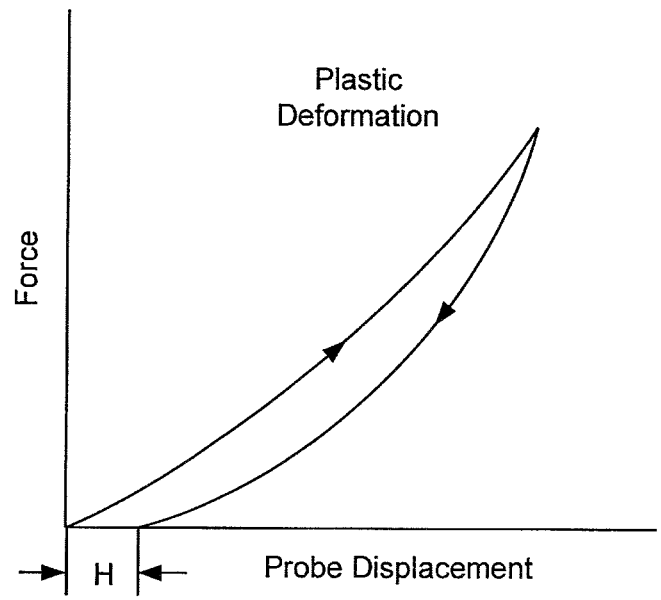

In addition to confirming XY location and performing electrical tests, the prior art conductive post CP and associated mechanism M are also used to determine the amount of force applied to each probe in the process of overtraveling the probe P. In those instances where applied forces are measured (this has been an optional feature of prior art devices), mechanism M will include a load cell (not shown) that measures the amount of force applied to a probe P by the conductive post CP on moving from no contact to overtravel OT positions. FIG. 6 shows one method whereby force and displacement can be measured. In an ideal setting, a probe P will not only be perfectly elastic, but will exhibit the nominal mechanical characteristics (spring constant, etc.) specified by the probe card's designers. See top portion of FIG. 6. But, as can be seen from the bottom portion of FIG. 6, deflection of a probe P may result in plastic deformation often referred to as hysteresis. Load cells (not shown) in mechanism M may be used to determine the amount of hysteresis (if any) that a probe P exhibits during deflection. When a probe P is deflected individually by a conductive post CP, this determination is relatively simple. When multiple probes P are overtraveled together, this determination is more difficult.

Figure 2:
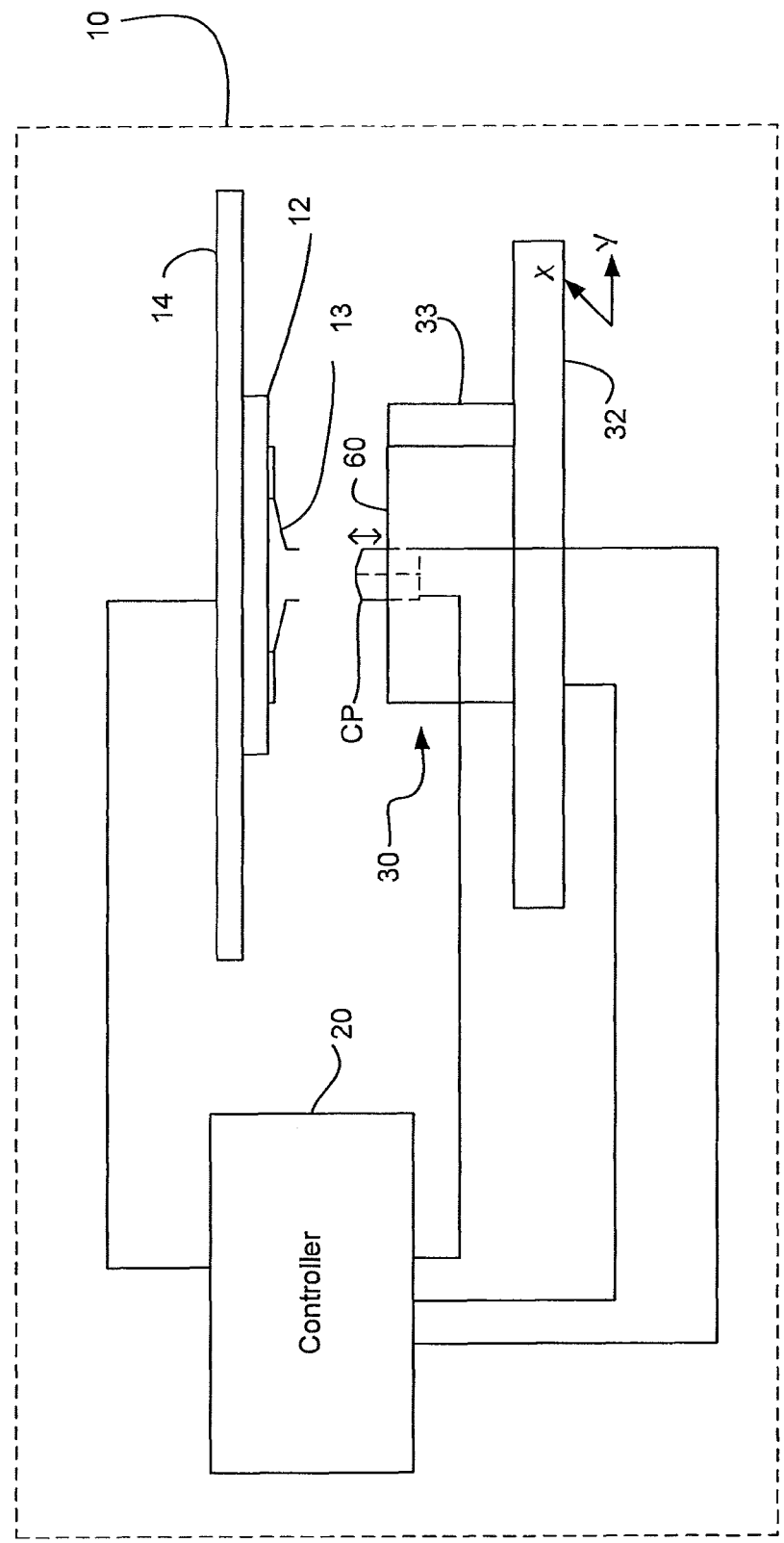
FIG. 2 is a schematic illustration of one embodiment of a probe inspection system according to the present invention.

FIG. 2 illustrates a basic embodiment of a probe card analyzing system 10 that is capable of applying selective overtravel to probes according to the present invention. A probe card 12 is mechanically and electrically coupled to a mother board 14 that is itself supported within the system 10. The mother board 14 electrically couples all or a select group of the probes 13 of the probe card 12 to a controller 20. The controller 20 may be one or more computers running software for analyzing the output of the mother board 14 and for controlling the remainder of the system 10 as described hereinbelow. In some embodiments the controller 20 is essentially a personal computer having an I/O facility (not shown) for receiving and transmitting signals from the mother board 14. The I/O facility transmits the signals to a processor and/or memory of the personal computer as necessary. The processor may analyze information received from the mother board 14 to determine if the probe card 12 and/or mother board 14 is operating correctly. The processor may modify data, combine data, collate data and perform any other computational analyses of the type that such computers are known to be capable of. In addition to using a single personal computer, in some embodiments, multiple personal computer modules, real or virtual, may be used to analyze data received from the mother board 14. Such modules may be contained within system 10 or may be distributed across a network of known types. In other embodiments, a tester of a type commonly used in a test cell may be used as a controller. It is intended that the controller not be limited to just those examples given above, but may include other variations on computational and storage systems now in use or produced in the future.

The controller 20 includes means (not shown) for controlling the position of a sensor 30 that is used to inspect and analyze probes 13 of probe card 12. Such means may include motion control cards or equivalent mechanisms. The controller 20 is electrically coupled to a stage 32 for moving the sensor 30 in an XY plane relative to the probes 13 of the probe card 12. In this way the sensor 30 may be addressed to selected ones or all of the probes 13 as desired. For example, the sensor 30 can address a first plurality of probes for testing, move out of contact with said first plurality of probes and then address a subsequent plurality of probes for testing. In one embodiment, the first plurality of probes and subsequent plurality of probes can include at least one probe that is part of each f the respective pluralities.

Accurately positioning the sensor 30 with respect to the probes P that are to be assessed can be difficult. In some situations where the position of probes is well understood, either from pre-existing information or due to the fact that the positions of probes P in certain types of probe cards are known to not vary significantly, the conductive post CP of sensor 30 may be addressed directly to the selected probes P for electrical test. Where there exists sufficient variability in XY position of probes P, a camera 33 coupled to stage 32 may be used to optically determine the XY and in some instances Z position of probes P hanging in free space. Simple 2D images of probes P can be used to determine the XY position of probes relative to encoders (not shown) that measure the position of the sensor 30 (and conductive post CP) relative to the probe card 12. Capturing multiple images of a probe P from various points of view allows one to determine a Z position of a probe P using the principle of parallax. In other instances the camera 33 may utilize confocal, triangulation, interferometric or in some instances associated non-optical techniques to determine a Z height of each probe.

Figure 3:
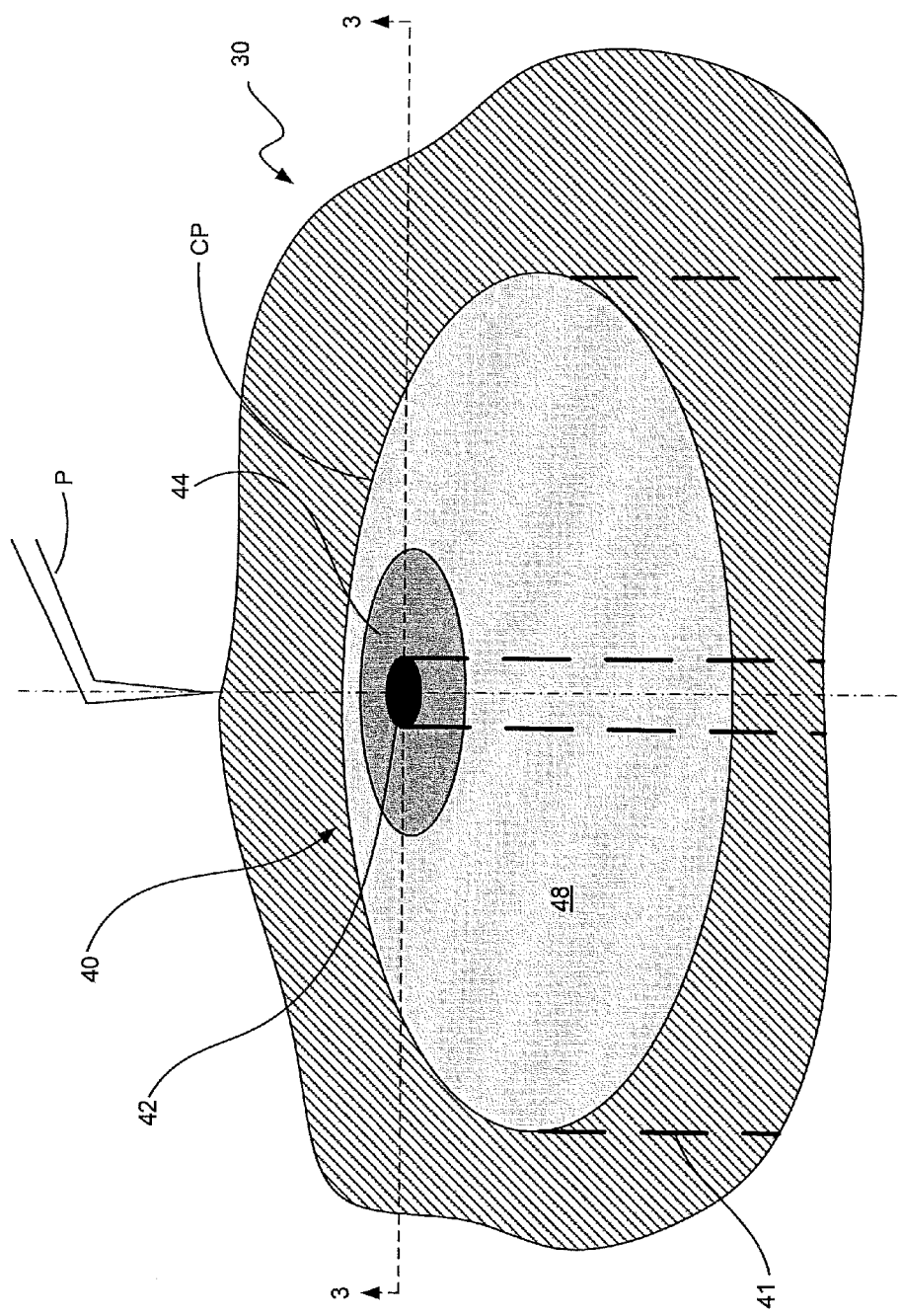
FIG. 3 is a schematic view of a tip of a test sensor according to one embodiment of the present invention.

In use then, the sensor 30 is moved by stage 32 to position conductive post CP relative to a probe P such that a tip of the probe P will contact the conductive tip of the conductive post when the conductive post CP is moved vertically with respect to the probe P. FIG. 3 provides a perspective view of a distal end or tip 40 of the conductive post CP. The distal end 40 of the conductive post CP has a conductive spot 42 that, when forced into contact with a probe P, will make electrical contact therewith. The conductive spot 42 is in some embodiments formed by boring a passage longitudinally through the body 41 of the conductive post CP and then inserting a conductive material therein. In one instance, a conductive and hard metallic material such as carbide, tungsten carbide or hardened steel may be inserted into a passage in the body 41 and then glued, soldered or welded into place.

Note that the body 41 of the conductive post CP that surrounds the conductive spot 42 is preferably non-conductive. In other instances, a powdered metal material may be placed in a longitudinal passage in the body 41 of the conductive post CP and then sintered to both lock the material in place and to form a hardened and conductive spot 42. In other instances, an existing hard and electrically conductive structure may have the body 41 of the conductive post CP formed therearound. For instance, in one embodiment a carbide wire having the same diameter as the desired conductive spot 42 will be covered in a suitable material such as a ceramic, a resinous material or a composite material of some useful combination to form the body 41 of the conductive post CP. The shape of the distal end 40 of the conductive post may be fashioned by grinding an existing conductive post blank to the desired shape after formation or by molding the conductive post CP to a desired shape at the outset of the fabrication process. Any suitable grinding, lapping, etching or other process that is required to obtain a desired shape and surface finish may be used so long as the conductive post CP has a conductive spot 42 that may be addressed to a probe P for electrical testing.

In some embodiments the conductive spot 42 is surrounded by flat or substantially flat area 44 that together form an inner bearing surface. In a preferred embodiment, the conductive spot 42 and the flat area 44 are circular and substantially concentric. The distance between the circumference of the conductive spot 42 and the circumference of flat area 44 is set so as to selectively address probes P adjacent to one that is in contact with the conductive spot 42. For example, in some embodiments it may be desirable to overtravel one or more probes P adjacent to one that is in contact with the conductive spot 42 identically. In this case, the planar surface defined by the conductive spot 42 and flat area 44 overtravels the addressed probes P substantially identically. The number of probes P that may be addressed by the flat area simultaneously with the probe P that is in contact with the conductive spot 42 is a function of the size of the flat area 44 relative to the pitch or position of the probes P to which the conductive post CP is addressed. A larger flat area 44 may address more probes P than a smaller one.

As suggested above, multiple probes adjacent to one being addressed to the conductive spot 42 may be contacted by the flat area if the size of the flat area is sufficient to encompass the adjacent probes. Conversely, where it is not desired to address adjacent probes in a manner that is identical to that in which the conductive spot 42 is addressed to a selected probe, the flat area 42 is made smaller than the spacing (pitch) between the selected probe and any adjacent probes. In some embodiments, the flat area 44 is omitted altogether. In another embodiment is may be desirable to form area 44 as a concave surface rather than a flat surface to direct a probe P into contact with the conductive spot 42. In such embodiments the conductive spot 42 itself may be planar or curvilinear, as needed. Care should be taken to not utilize a concave area 44 having too large a gradient; this avoids laterally displacing a probe P as the conductive post CP is driven into contact therewith. That being said, in applications where minor XY misalignments may be tolerated, e.g. where electrical testing alone is of importance, a conductive post CP have a curvilinear distal end 40, preferably concave, may be used.

As can also be seen in FIG. 3, an inclined surface 48 is positioned circumjacent to the conductive spot 42 (and to the flat/concave area 44 if one is provided). The inclined surface 48 pictured in FIG. 3 is essentially frustoconical but might be any suitable shape or surface of revolution that is formed about an axis of the conductive post CP. In one embodiment, the surface 48 forms an outer bearing surface that is non-coplanar with the conductive spot 42 and flat area 44 (if provided), which together form the inner bearing surface as discussed above. Note that in some instances it may also be desirable to form the inclined surface in an asymmetrical manner, either radially or circumferentially. In addition to being generally conical, the inclined surface 48 may be pyramidal or faceted to any useful degree.

Figure 4:
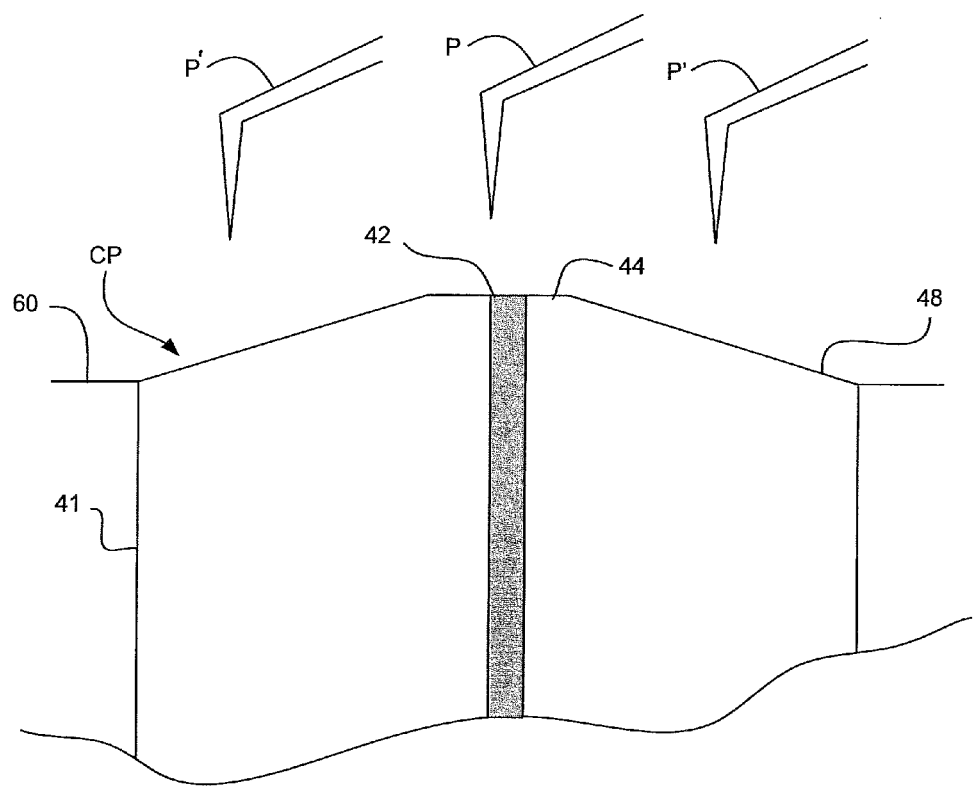
FIG. 4 is a schematic elevation view of a test sensor according to one embodiment of the present invention.

The inclined surface 48 is shaped and sized so as to selectively overtravel probes P to which it is addressed. As can be seen in FIG. 4, which is a cross section of the embodiment shown in FIG. 3, the inclined surface 48 may be addressed to probes P', which are adjacent to probe P which is to be addressed by the conductive spot 42 of the conductive post CP. The diameter of the conductive post CP may be expanded or contracted to encompass more or fewer probes P and P', as needed. Similarly, the shape of the inclined surface 48 may be modified to provide a selected level of overtravel relative to probes P' addressed thereby as compared to the probe P that is addressed by the conductive spot 42. For example, the relative short frustum of the inclined surface 48 shown in FIG. 4 will overtravel an adjacent probe P' to a greater degree than will an inclined surface having a steeper inclination. Further, rather than a frustoconical surface, a curvilinear inclined surface 48 may selectively modify the amount of overtravel applied to a probe P' as a function of the adjacent probe's distance from the conductive spot 42, i.e. a first adjacent probe P' that is farther away from the conductive spot 42 than a second adjacent probe P' may be overtraveled an amount that is linearly or non-linearly dependent upon the distance a probe P' is from the conductive spot 42, as necessary for the application. In further embodiments, a maximal diameter of the conductive spot 42 and flat area 44 (if provided) forming the inner bearing surface can be selected to be less than a distance between adjacent probes P and P'. Further still, a maximal dimension of the inclined surface 48 forming the outer bearing surface can be selected such that at least one other probe (i.e., P') is contacted by surface 48 during overtravel.

Figure 5:
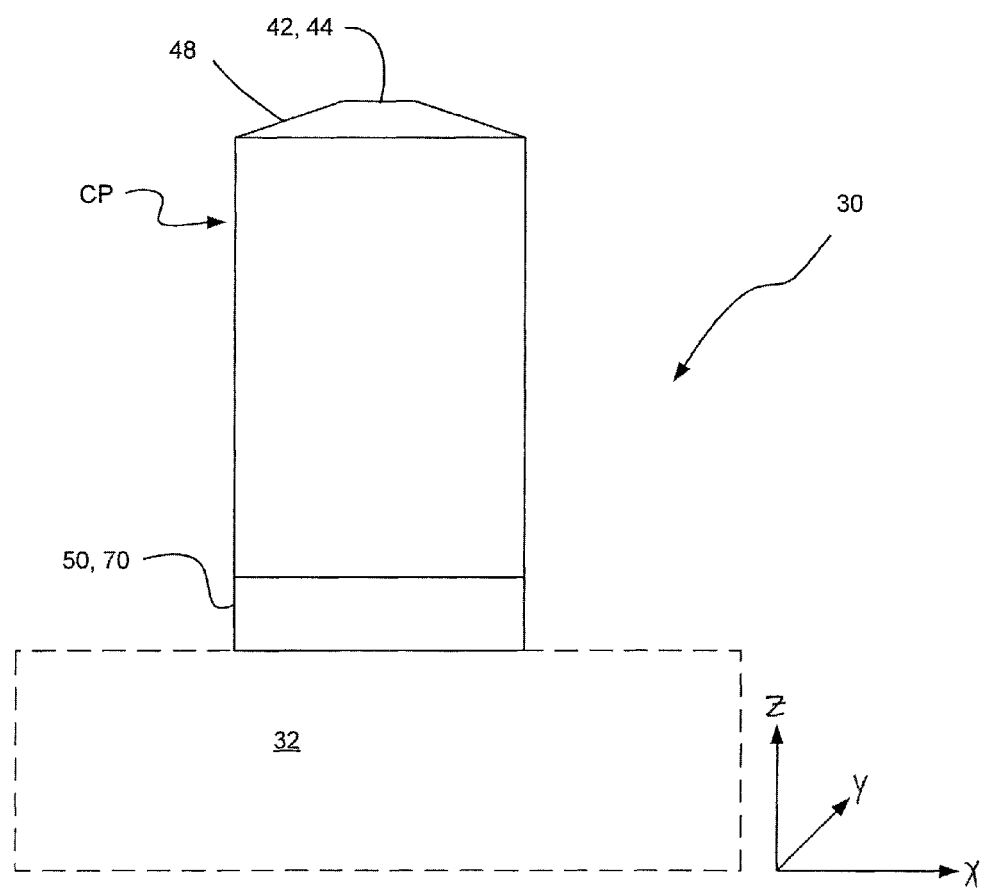
FIG. 5 is a schematic elevation view of one embodiment of a test sensor and associated stages, actuators and/or sensors.

As illustrated in FIG. 5, during use and assuming that sufficient positional information (XY and/or Z) is known, the sensor 30 moves the conductive post CP into alignment with a selected probe P. Thereafter, a vertical actuator 50 moves the conductive post CP into contact with a tip of the selected probe P. In some embodiments the vertical actuator moves the conductive post CP only. In other embodiments, the entire sensor 30 or some portion thereof that includes the conductive post CP will move together in a vertical direction to contact the probes. Where the Z height of the tip of the probe P is known, the conductive post will move to a vertical position that imposes a desired overtravel to the probe P. Where the Z height of a probe P is not known, then a set vertical travel may be imposed. This set vertical travel may not achieve a desired overtravel, the set amount being either too large or too small. However, this mode of operation is often sufficient to ensure some overtravel and electrical contact. In other embodiments, the conductive post will be vertically travelled until electrical contact is made with the probe P at which time the vertical position of the distal end of the conductive post CP will be noted and a desired additional overtravel will be specified by adding a specified amount to the noted vertical position of the conductive post CP. Once overtravel has been completed, electrical tests of the probe P may be conducted. These may include connectivity, short circuit, resistance and capacitance, among others. In other instances, simple connectivity of a probe P may be assessed by contacting the conductive spot 42 of the conductive post CP to a probe P without overtraveling the conductive post CP with respect to the probe P to any significant degree.

The sensor 30 may include a check plate 60 against which probes may be overtraveled en masse (FIG. 2). Alternatively, the conductive post CP may be deployed by itself, with or without a related imaging system or camera for determined XY and/or Z position of probes as illustrated in FIG. 5. The conductive post CP may be coupled to a load cell 70. The load cell 70 measures the amount of force that is applied between the conductive post and the one or more probes that are overtraveled by the conductive post CP. Where the spacing of the probes and the relative dimensions of the conductive post allow, the conductive post CP may be applied to a selected probe without overtraveling adjacent probes as the adjacent probes may be too far from the selected probe to be so addressed. In this case it is a simple matter to measure the load applied to a probe for a given overtravel. But where, as is normally the case, multiple probes are overtraveled to varying degrees, the load cell will measure a force that is spread out over the probes that are overtraveled by the conductive post CP. Under such circumstances it is possible to use the load cell merely as a sensor for identifying situations in which one or more probes present a significant excursion from acceptable load parameters. For example, where significantly too little or too much force is exerted by a group of probes against the conductive post CP, an error code indicating that further inquiry into the load variance may be generated and later investigated. Alternatively, loads for each probe that is overtraveled may be collected, each of the collected load data including components related to the multiple probes that are addressed to the conductive spot 42 or to the inclined surface 48. Once all probes have been overtraveled and the data collected, the individual forces obtained from each individual probe may be determined. Mathematically this is accomplished by solving a number of linear equations simultaneously, the individual equations being representative of the force components contributed by individual probes during inspection.

Note that the load applied to the conductive post CP by the probes may be measured in a static manner, as where the conductive post CP has fully applied the specified overtravel or dynamically during reciprocation of the conductive post relative to the probes to which it is addressed. Measuring the load applied to the conductive post CP during both the application and reduction of overtravel/force allows one to assess whether there are discontinuities in the manner in which a probe or probes exert force. As described with respect to displacement, differences in how loads are applied and reduced with respect to a single probe or group of probes may be analyzed for hysteresis that is indicative of problems with the probe(s) or the probe card.

Figure 7:
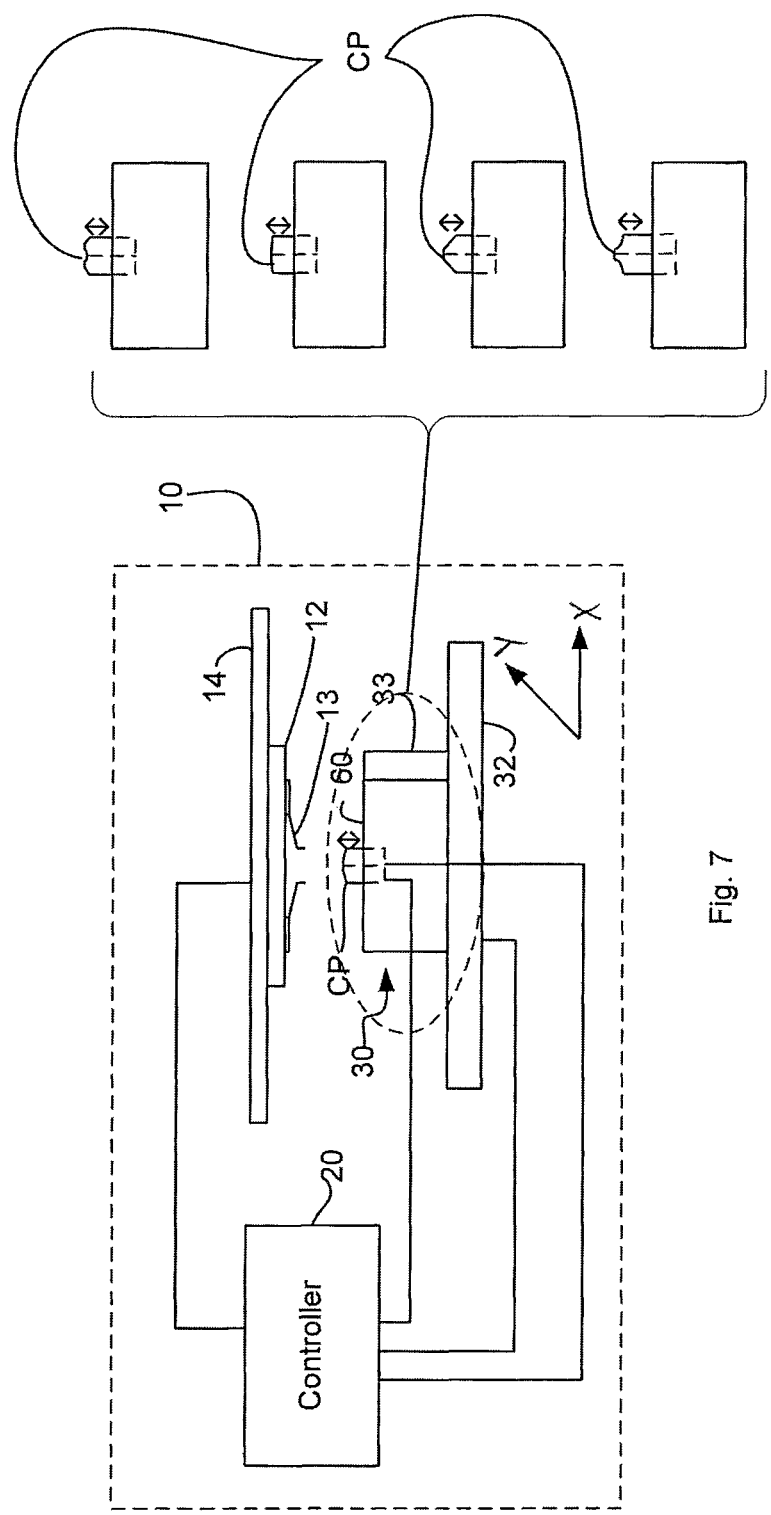
FIG. 7 illustrates an embodiment of the present invention in which the assembly that facilitates the test sensor is interchangeable with assemblies having test sensors of different geometries.

FIG. 7 illustrates an embodiment of the present invention in which at least the conductive post CP may be interchanged depending on the application in question. In some embodiments, the conductive post CP may fit within a bore in the sensor 30 such that only the distal end thereof extends above a check plate 60. The conductive post CP may be removed from its bore and replaced as needed. Alternatively, the entire sensor 30 may be changed with the conductive post CP. Any useful mechanism for coupling the conductive post CP to the sensor 30 may be utilized. In some applications the conductive post may be withdrawn by hand without need for tools and then replaced with a different conductive post. In other embodiments, a rack (not shown) of different conductive posts CP may be provided such that the sensor 30 may automatically select a desired conductive post CP based on a set of instructions or a recipe operating on the controller 20 of the system 10 in a manner akin to the way in which a pen plotter changes pens for each color.

CONCLUSION

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of measuring electrical characteristics of a probe under mechanical load comprising:
    providing a sensor having a tip with an inner bearing surface and an outer bearing surface, the outer bearing surface being circumjacent to the inner bearing surface, the inner and outer bearing surfaces being non-coplanar with respect to one another, the sensor having a conductive portion formed in the inner bearing surface;
    overdriving the sensor into contact with a first plurality of probes such that a predetermined probe of the plurality of probes is in contact with the conductive portion of the inner bearing surface, thereby forming a part of a test circuit while the probe is under a mechanical force due to the overdriving, the outer bearing surface overdriving at least one other of the plurality of probes an amount that differs from the predetermined probe that is in contact with the conductive portion of the inner bearing surface; and,
    moving the sensor out of contact with the plurality of probes and subsequently overdriving the sensor into contact with a subsequent plurality of probes.

2. The method of measuring electrical characteristics of a probe under mechanical load of claim 1 wherein the first and subsequent pluralities of probes include at least one probe that is part of each of the respective pluralities.

3. The method of measuring electrical characteristics of a probe under mechanical load of claim 1 further comprising:
    measuring an electrical characteristic of the test circuit.

4. The method of measuring electrical characteristics of a probe under mechanical load of claim 1 further comprising:
    measuring an electrical characteristic of the probe that is in contact with the conductive portion.

5. The method of measuring electrical characteristics of a probe under mechanical load of claim 1 wherein the inner bearing surface is substantially planar and the outer bearing surface is substantially conical.

6. The method of measuring electrical characteristics of a probe under mechanical load of claim 1 wherein the inner bearing surface is substantially planar and the outer bearing surface is pyramidal.

7. The method of measuring electrical characteristics of a probe under mechanical load of claim 1 wherein the inner bearing surface is substantially planar and the outer bearing surface is curvilinear.

8. The method of measuring electrical characteristics of a probe under mechanical load of claim 1 wherein the inner bearing surface has a maximal dimension that is less than a distance between adjacent probes in the plurality of probes.

9. The method of measuring electrical characteristics of a probe under mechanical load of claim 1 wherein the outer bearing surface has a maximal dimension such that at least one other probe of the probe card is contacted by the outer bearing surface during overtravel.

10. The method of measuring electrical characteristics of a probe under mechanical load of claim 1 wherein the at least one probe in contact with the conductive portion of the inner bearing surface is overtraveled an amount that is greater than the amount to which the at least one other probe in contact with the outer bearing surface is overtraveled.

11. The method of measuring electrical characteristics of a probe under mechanical load of claim 1 wherein the at least one other probe is a plurality of probes and wherein the amount of overtravel applied to each of the probes in contact with the outer bearing surface differs as a function of location of the probe.

12. The method of measuring electrical characteristics of a probe under mechanical load of claim 11 wherein the magnitude of the overtravel applied to probes in contact with the outer bearing surface is inversely proportional to the probe's distance from the inner bearing surface.

13. The method of measuring electrical characteristics of a probe under mechanical load of claim 11 wherein the spatial variation in the magnitude of the overtravel applied to probes in contact with the outer bearing surface is inversely linearly proportional to the probe's distance from the inner bearing surface.

14. An apparatus for inspecting probes of a probe card comprising:

a sensor having a distal end having a first bearing surface and a second bearing surface, the second bearing surface being circumjacent to the first bearing surface, the first and second bearing surfaces being non-coplanar with respect to one another, the first bearing surface having a conductive portion formed therein, the first bearing surface having a maximum dimension that is less than twice a distance between a selected one of the probes of the probe card and an adjacent probe, the second bearing surface having a conical shape;

an actuator to which the sensor is coupled, the actuator for moving the sensor between a first position in which the sensor is not in contact with any probe of the probe card and a second position in which the sensor is driven in contact with at least one probe of the probe card;

a movement mechanism for moving the sensor relative to the probe card in an XY plane that is nominally parallel to a plane formed by the tips of the probes of the probe card so as to successively address the conductive portion of the sensor to selected ones of the probes of the probe card; and, a controller communicatively coupled to the probe card, the sensor, the actuator and the movement mechanism for providing control signals to the movement mechanism to align the conductive spot of the sensor with a selected one of a group of probes, to cause the actuator to move to the sensor to its second position so as to complete an electrical circuit from the controller to the sensor, through the probe card and back to the controller, the controller being arranged to analyze signals received from the electrical circuit.

* * * * *